(12) United States Patent
Moll et al.

(10) Patent No.: US 7,544,562 B2
(45) Date of Patent: Jun. 9, 2009

(54) METHOD FOR MANUFACTURING A CAPACITOR ELECTRODE STRUCTURE

(75) Inventors: Peter Moll, Dresden (DE); Odo Wunnicke, Dresden (DE)

(73) Assignee: Qimonda AG, Munich (DE)

( * ) Notice: Subject to any disclaimer, the term of this patent is extended or adjusted under 35 U.S.C. 154(b) by 422 days.

(21) Appl. No.: 11/489,052

(22) Filed: Jul. 19, 2006

(65) Prior Publication Data
US 2008/0006863 A1 Jan. 10, 2008

(30) Foreign Application Priority Data
Jul. 6, 2006 (DE) ............... 10 2006 031 324

(51) Int. Cl.
*H01L 21/8234* (2006.01)
*H01L 21/8244* (2006.01)
*H01L 21/8242* (2006.01)

(52) U.S. Cl. ............... 438/238; 438/239; 438/210; 438/253; 438/304; 438/396; 257/E21.008; 257/E21.646; 257/E21.651

(58) Field of Classification Search ......... 257/E21.008, 257/E21.647, E21.651
See application file for complete search history.

(56) References Cited

U.S. PATENT DOCUMENTS 7,468,306 B2 * 12/2008 Thies et al. .............. 438/396

| | | | |
|---|---|---|---|
| 2003/0136996 A1 * | 7/2003 | Park | 257/303 |
| 2004/0185613 A1 | 9/2004 | Lin et al. | |
| 2005/0285176 A1 | 12/2005 | Kim | |
| 2006/0046420 A1 | 3/2006 | Manning | |
| 2008/0003740 A1 * | 1/2008 | Wunnicke et al. | 438/238 |

OTHER PUBLICATIONS

German Office Action dated May 21, 2007.

* cited by examiner

*Primary Examiner*—Walter L Lindsay, Jr.
*Assistant Examiner*—Mohsen Ahmadi
(74) *Attorney, Agent, or Firm*—Eschweiler & Associates LLC

(57) ABSTRACT

A method for manufacturing a capacitor electrode structure, according to which the following steps are executed: A substrate is provided, which comprises contact pads arranged in lines and rows on a surface of the substrate. The lines are non-parallel to the rows. A first mold is applied on the substrate. At least one first trench is formed into the first mold above the contact pads. The first trench spans over at least two contact pads arranged in one row. A first dielectric layer is applied on side walls of the at least one first trench for forming first supporting walls. A second mold is applied on the substrate. At least one second trench is formed into the second mold above the contact pads. The second trench spans over at least two contact pads arranged in one line. A second dielectric layer is applied on side walls of the at least one second trench for forming second supporting walls. And a conductive layer is applied on the first and second supporting walls for forming a first electrode of the capacitor structure.

11 Claims, 16 Drawing Sheets

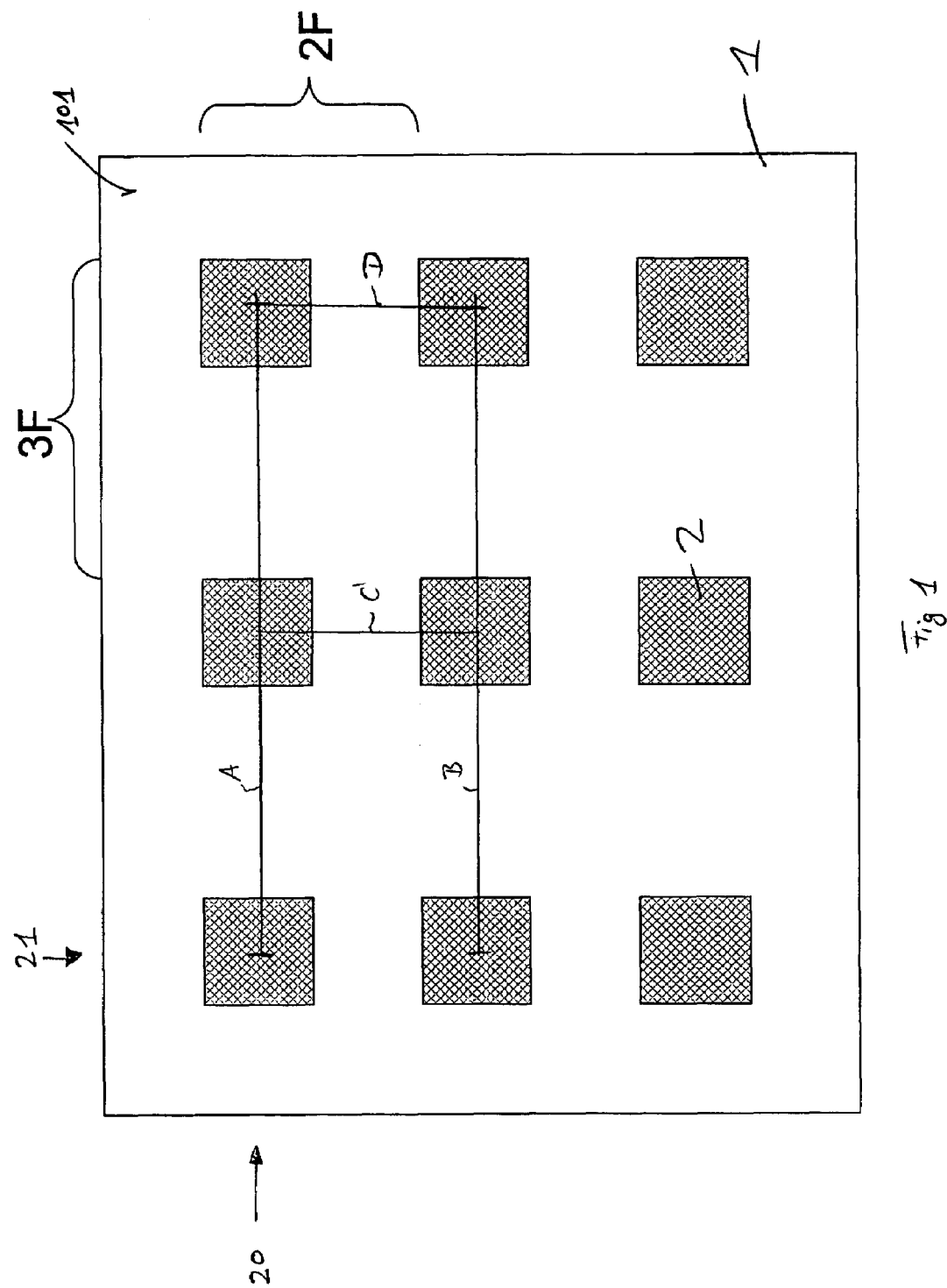

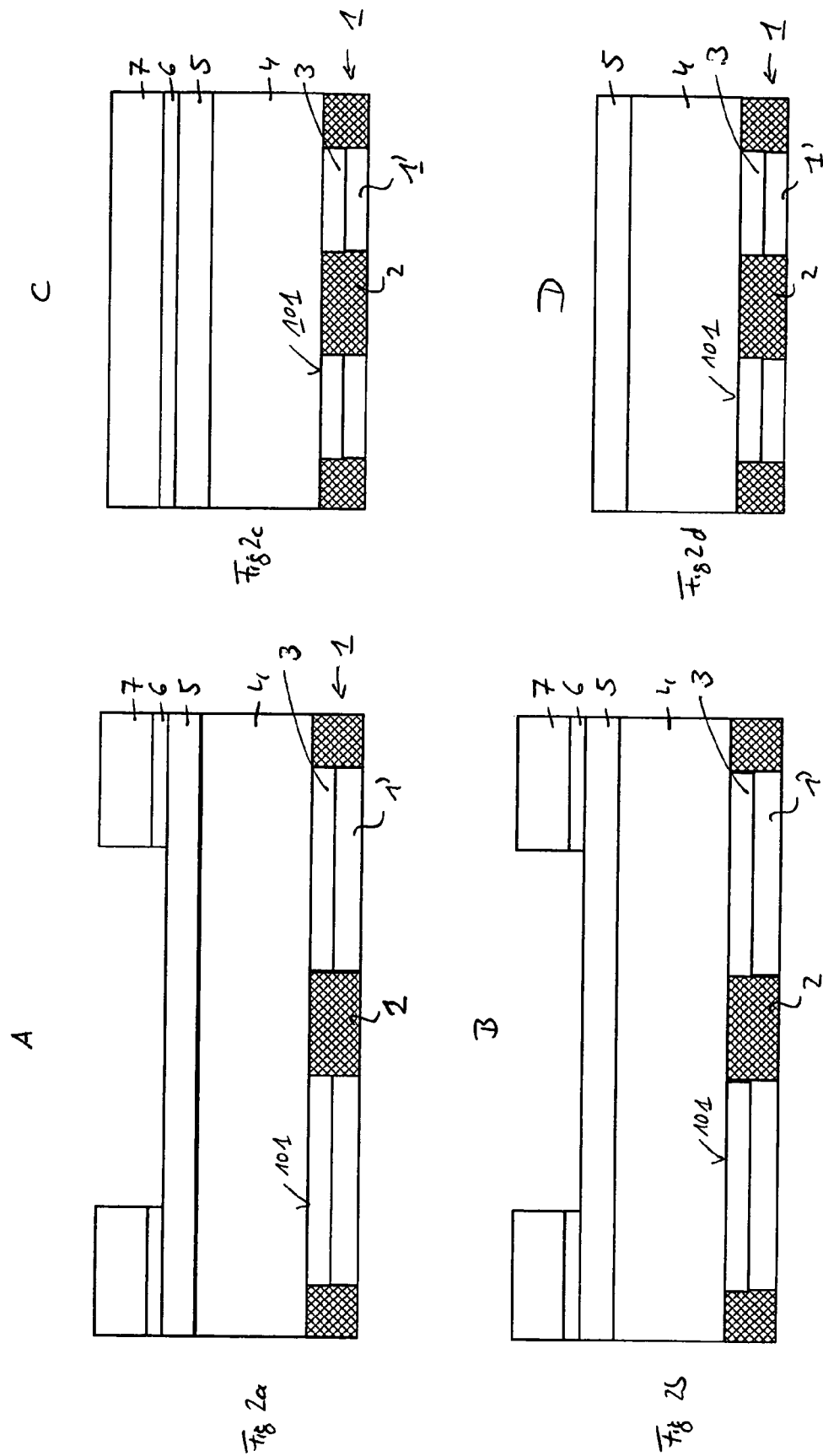

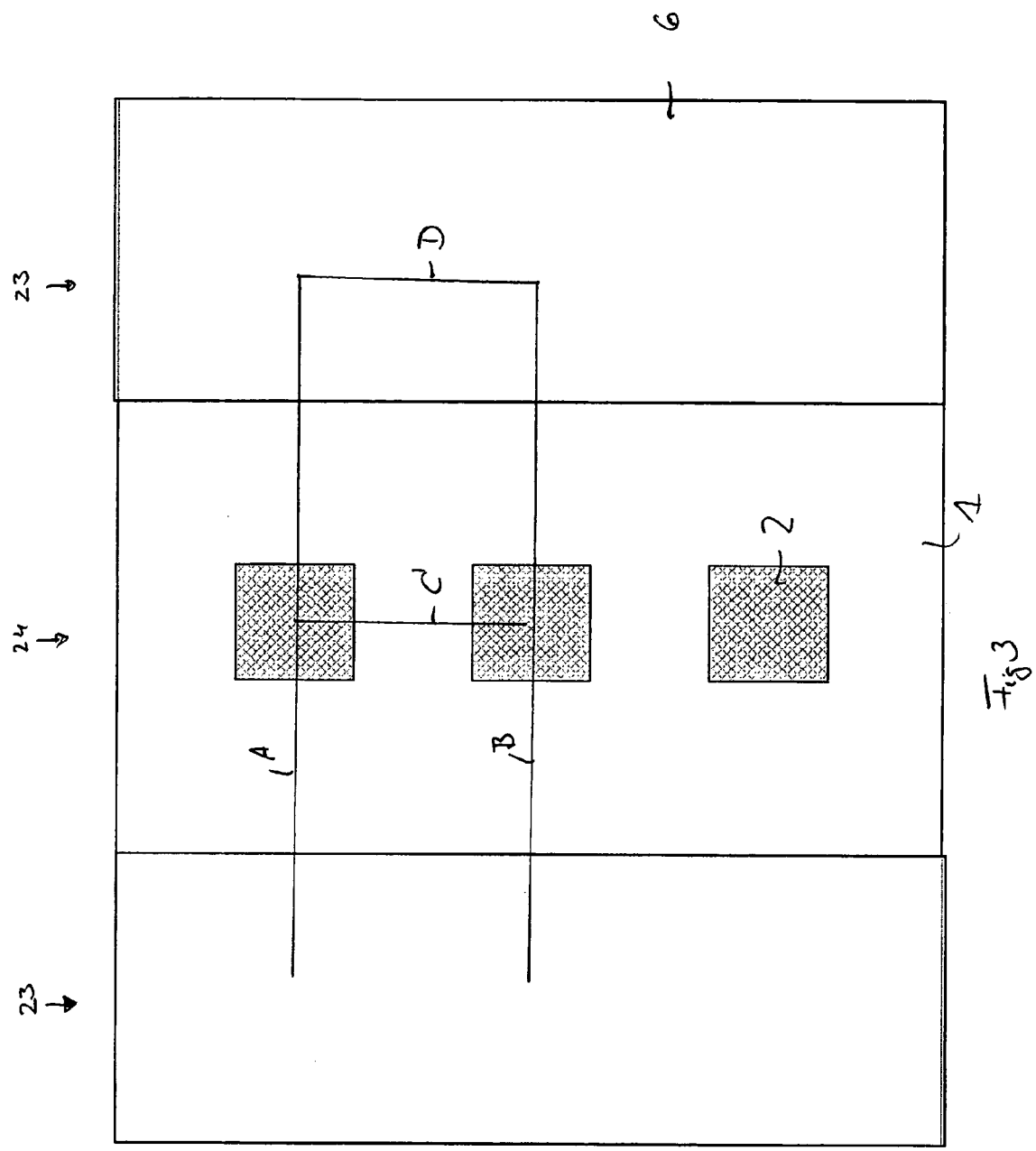

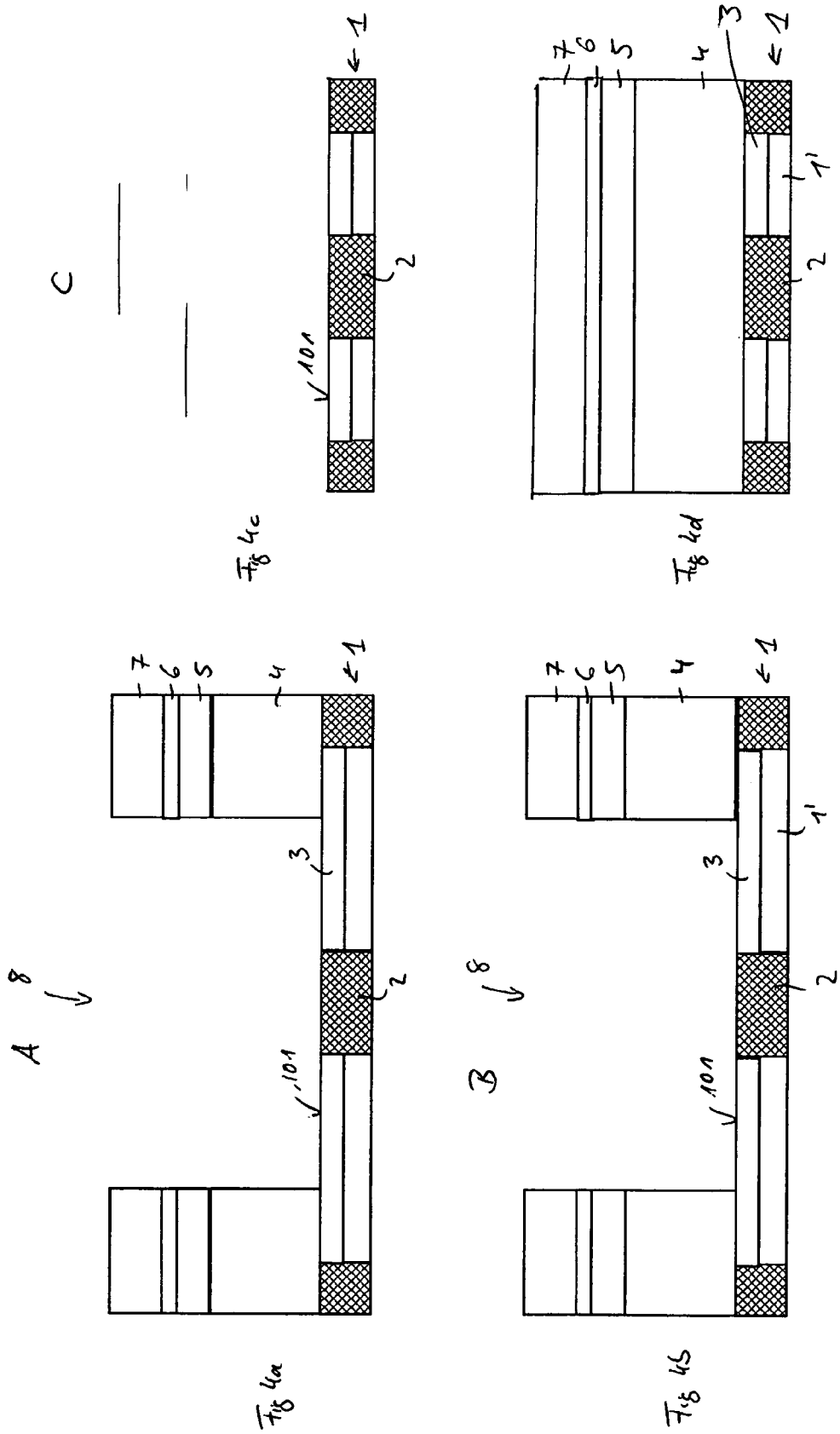

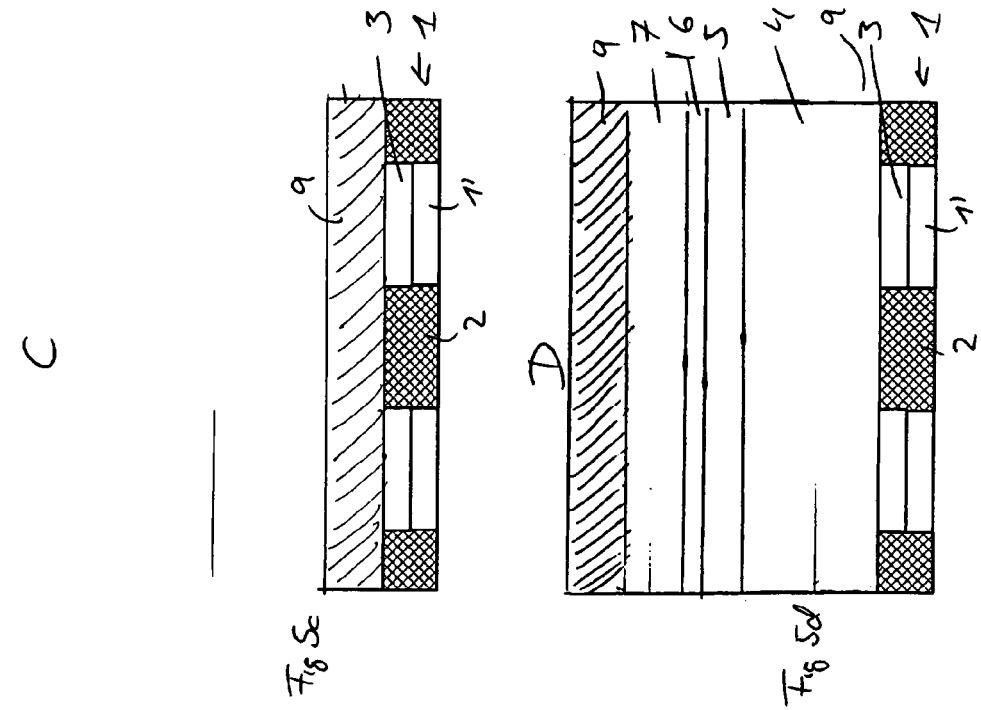
Fig 5c
Fig 5d
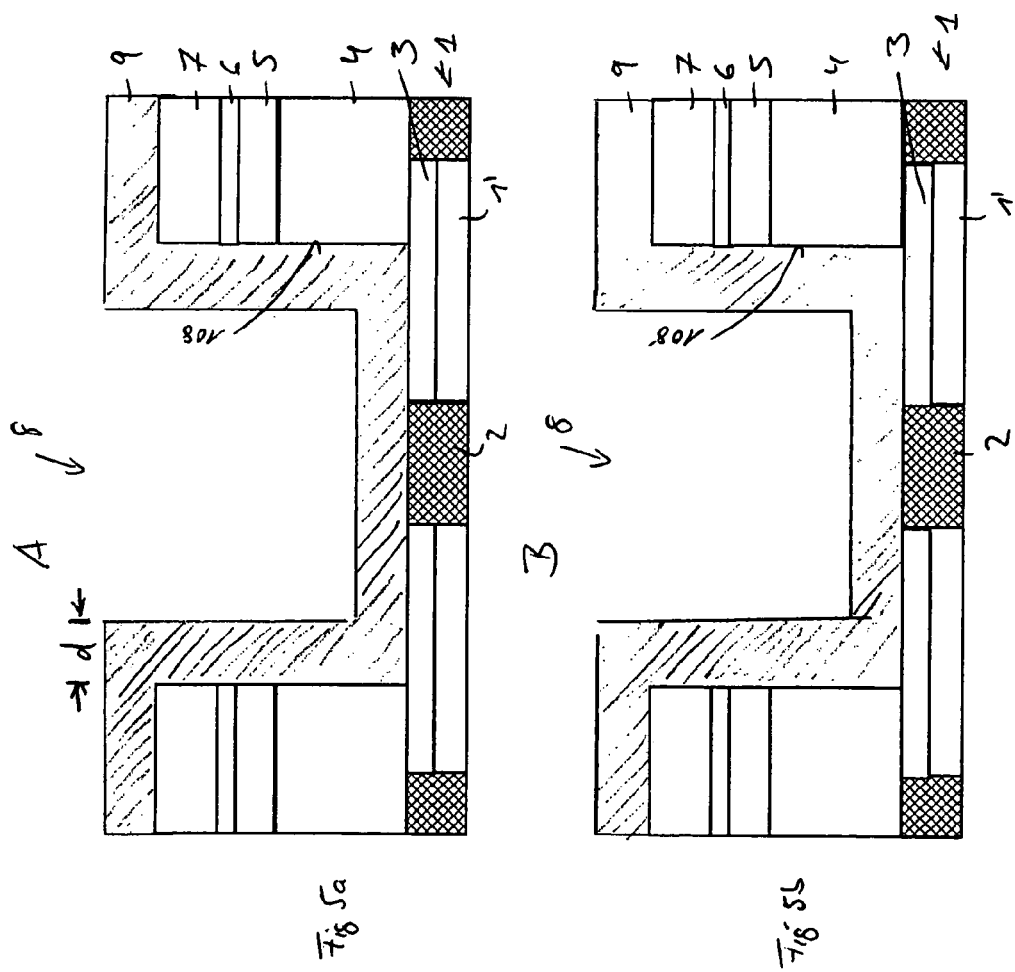
Fig 5a
Fig 5b

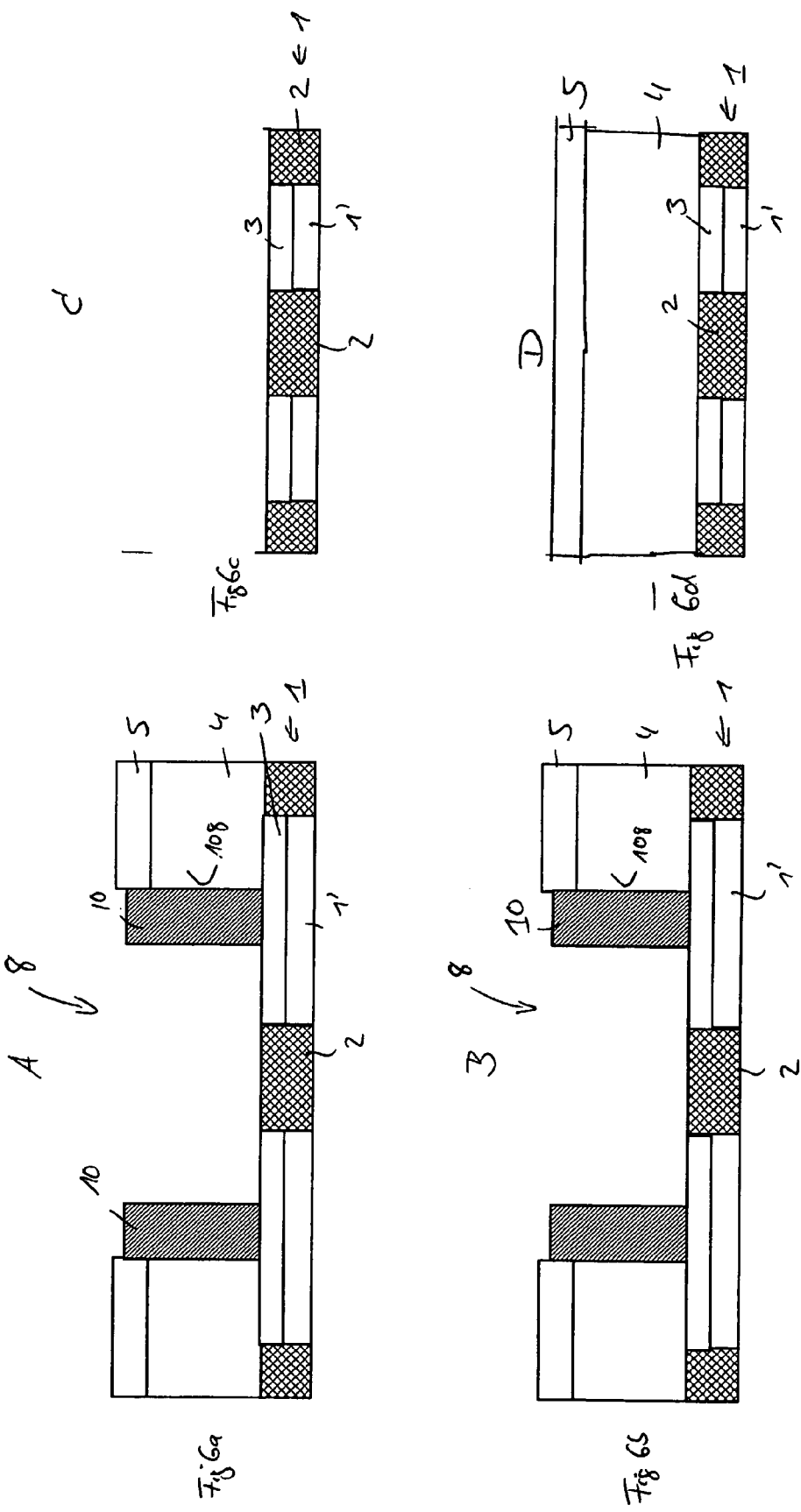

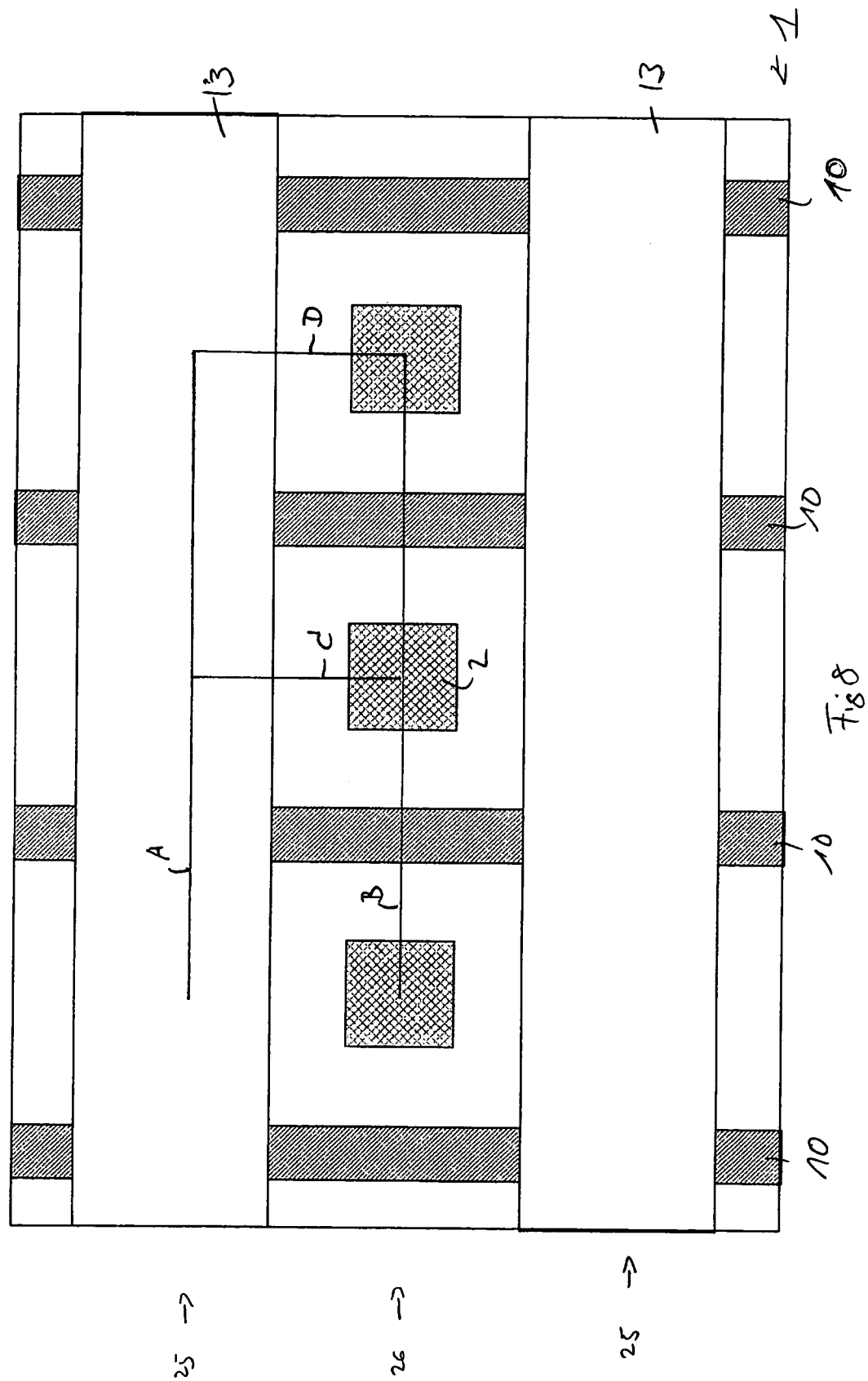

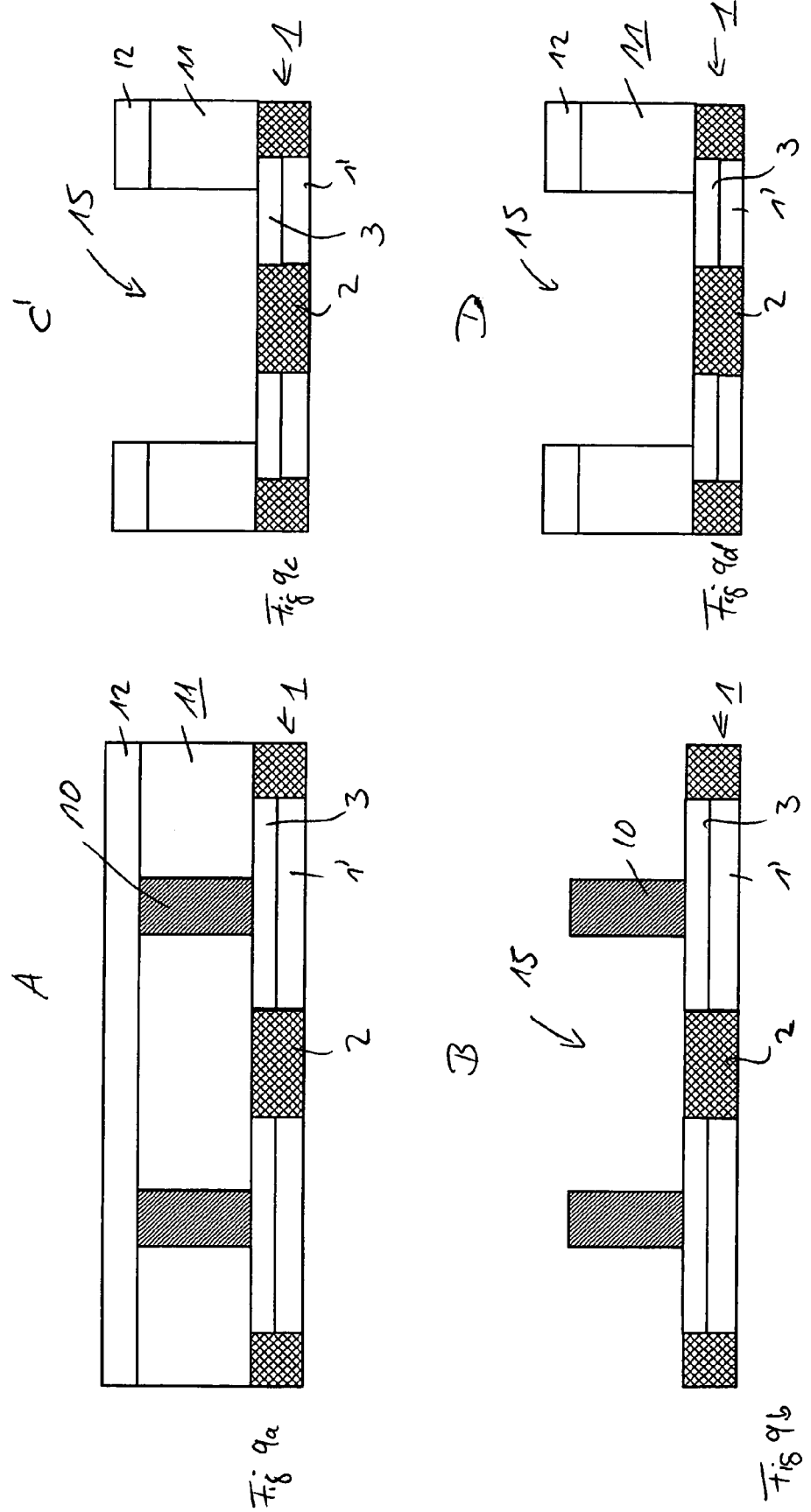

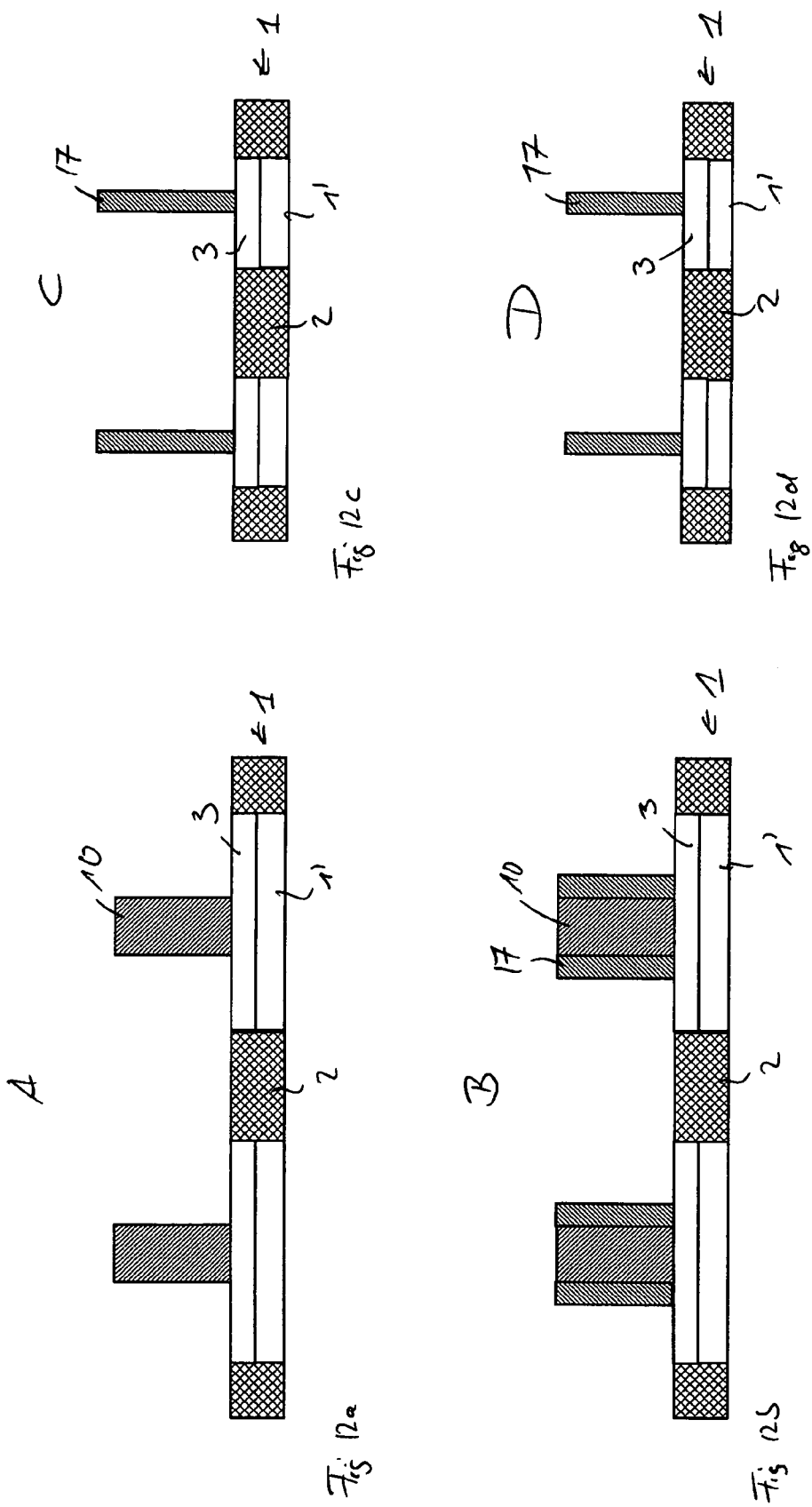

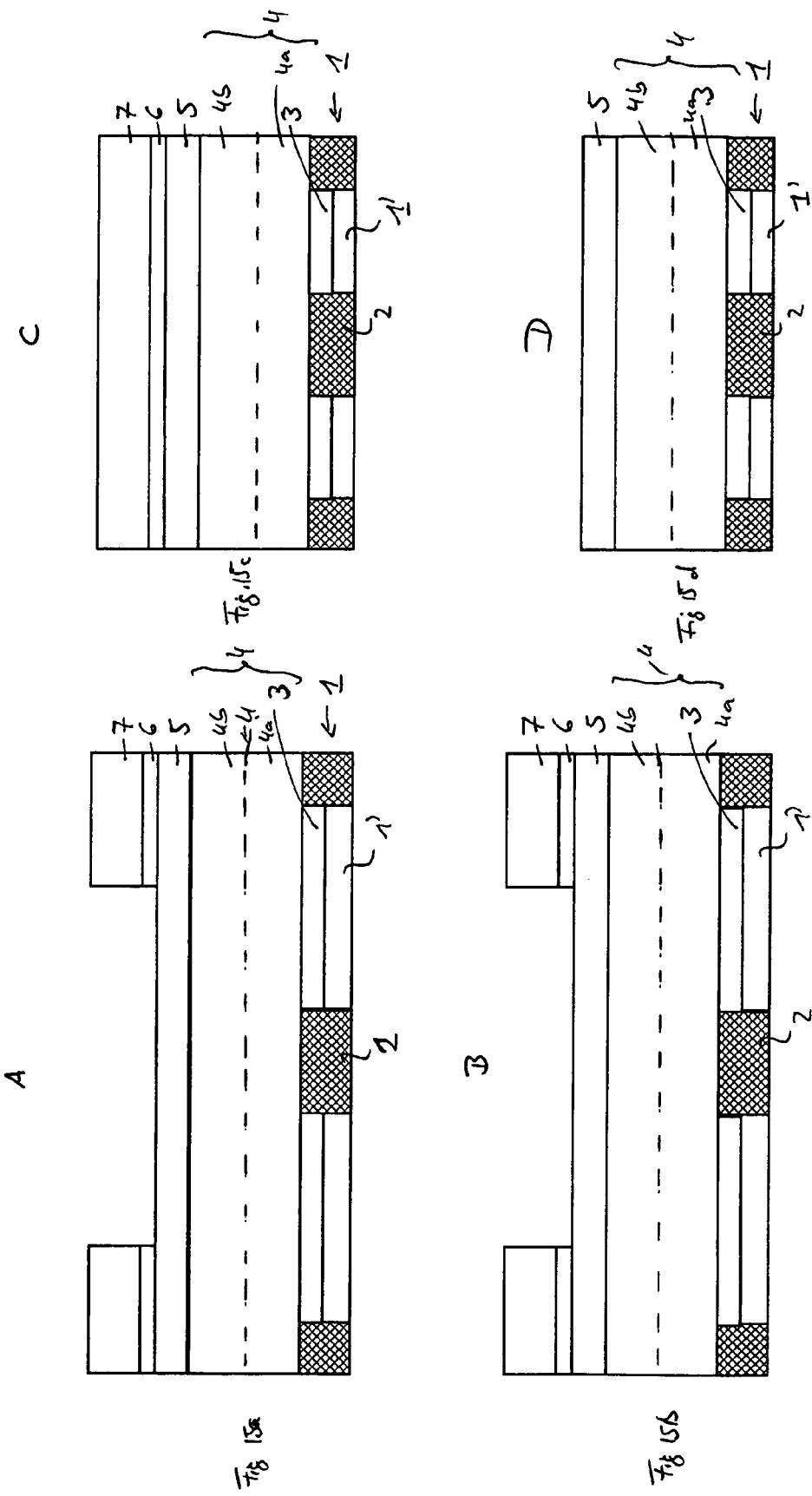

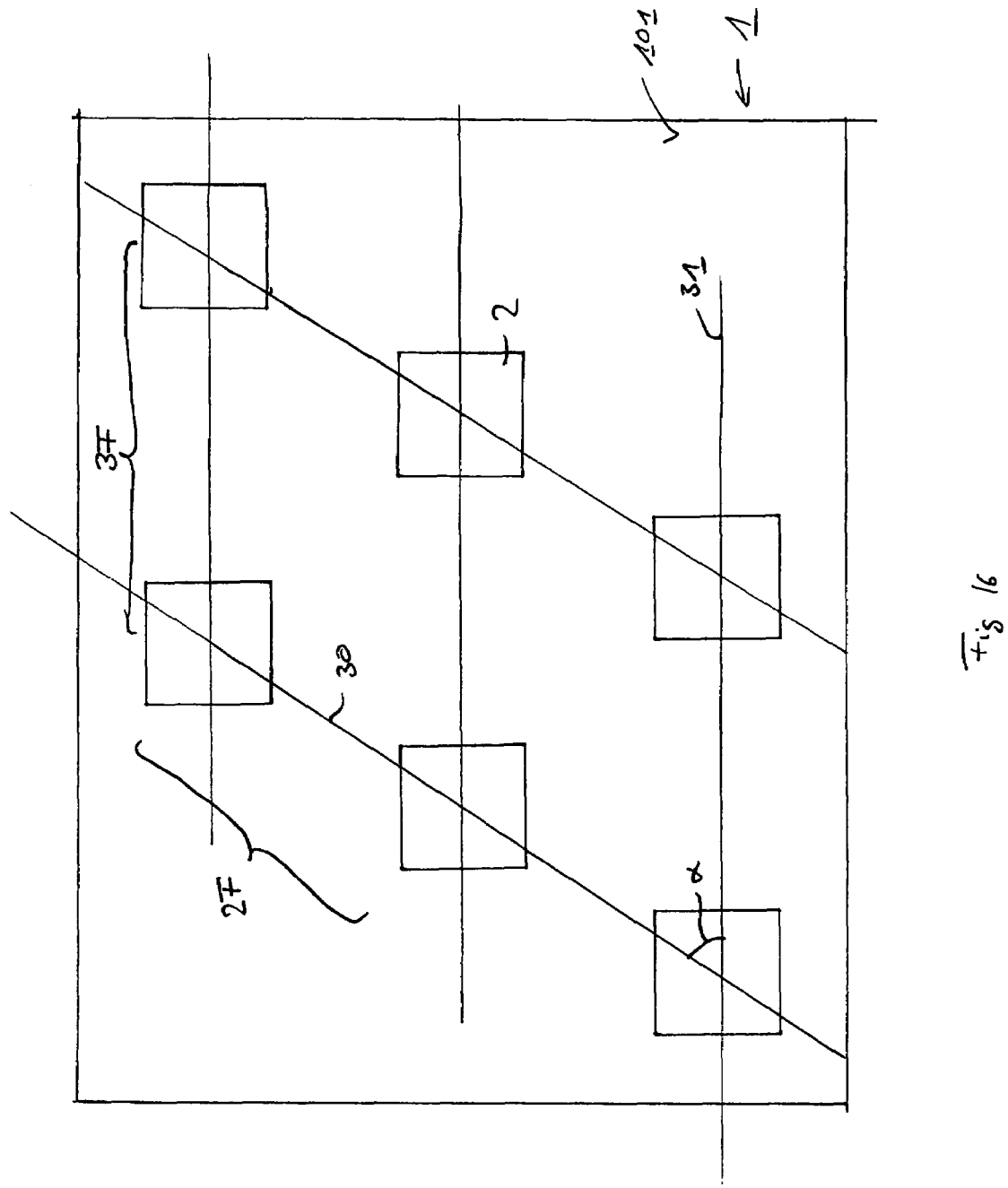

METHOD FOR MANUFACTURING A CAPACITOR ELECTRODE STRUCTURE

BACKGROUND OF THE INVENTION

The present invention relates to a method for manufacturing a capacitor electrode structure. Further, the present invention relates to a capacitor electrode structure.

DESCRIPTION OF THE RELATED ART

The memory capacity of DRAM memory devices per unit area shall be increased for technical and economical reasons. The DRAM memory device comprises a plurality of memory cells. Each of them can store a single information unit in its capacitor. An increase of the memory capacity per unit area can be achieved by reducing the horizontal dimensions, i.e. in the plane of the DRAM memory device, of these capacitors.

For a reliable operation of the memory cells, the electric capacity of the capacitors must be kept above a minimal value. As the electric capacity is proportional to both the vertical and the horizontal dimensions, the vertical dimension of the capacitors is increased when the horizontal dimensions are reduced. Nowadays, the capacitors comprise a diameter in the range of 100 nm or less and a height of several hundreds of nanometers.

A manufacturing process known to the inventor starts by forming a free standing first electrode on a substrate surface. The first electrode comprises basically the same height as the later formed capacitor, and may comprise a diameter even less than the capacitor. The mechanical stability of this first electrode is therefore very limited. Thus, some of the first electrodes collapse or are deformed before or during the continued manufacturing process.

BRIEF SUMMARY OF THE INVENTION

According to a first aspect of the invention as claimed in claim 1, a method for manufacturing a capacitor electrode structure comprises the steps:
providing a substrate comprising contact pads arranged in lines and rows on a surface of the substrate, the lines being non-parallel to the rows;
applying a first mold on the substrate;
forming at least one first trench into the first mold above the contact pads, the first trench spanning over at least two contact pads arranged in one row;
applying a first dielectric layer on side walls of the at least one first trench for forming first supporting walls;
applying a second mold on the substrate;
forming at least one second trench into the second mold above the contact pads, the second trench spanning over at least two contact pads arranged in one line;
applying a second dielectric layer on side walls of the at least one second trench for forming second supporting walls; and
applying a conductive layer on the first and second supporting walls for forming a first electrode of the capacitor structure.

An idea is to provide a supporting grid, on which an electrode is formed. The supporting grid obtains its stability by the intersecting supporting walls. During the manufacturing process of the supporting walls, they are not free standing, until the grid is formed. A collapse of the supporting walls or the electrode is therefore unlikely.

According to a second aspect of the invention the capacitor electrode structure comprises: contact pads arranged in lines and rows on a surface, the lines being non-parallel to the rows; at least one first supporting wall arranged parallel and between two rows of contact pads; at least one second supporting wall arranged parallel and between two lines of contact pads; and an electrode formed on the sides of the first supporting walls and on the sides of the second supporting walls.

According to a third aspect of the invention capacitor structure comprises: contact pads arranged in lines and rows on a surface, the lines being non-parallel to the rows; a grid formed by intersecting first supporting walls and second supporting walls; the first supporting wall comprising a first thickness in first sections and a second thickness in second sections, the first sections and the second sections are alternating along the length of the first supporting walls; and an electrode formed on the sides of the first supporting walls and on the sides of the second supporting walls.

In one embodiment of the invention the lines are perpendicular to the rows. The lines and rows can form an angle in the range of 30 to 90 degrees.

In one embodiment of the invention the width of the first trench and the width of the second trench are at least larger then the dimension of the contact pad.

In one embodiment of the invention the contact pads are separated from each other along the lines by a first distance and are separated from each other along the rows by a second distance, the first distance being approximately twice the second distance.

In one embodiment of the invention the first dielectric layer is applied with a first thickness and the second supporting is applied with a second thickness, the first thickness being larger than the first thickness.

In one embodiment of the invention the first mold comprises a first mold layer, which is chosen to be etched at a first etch rate with an etch agent, and a second mold layer, which is chosen to be etched at a second etch rate with the etch agent, the second etch rate being larger than the first etch rate.

In one embodiment of the invention the second mold is formed by filling the first trenches and by keeping the remaining parts of the first mold.

BRIEF DESCRIPTION OF THE DRAWINGS

Preferred embodiments of the method for manufacturing capacitor structures according to the invention will be described below with reference to the attached figures for explaining the features of the invention.

In the figures:

FIG. 1 shows a top view on a semiconductor substrate according to a first embodiment of the invention.

FIGS. 2a to 2d show cross sections of the semiconductor substrate for illustrating first steps of the first embodiment.

FIG. 3 shows a top view on the semiconductor substrate for illustrating second steps of the first embodiment.

FIGS. 4a to 4d show cross sections of the semiconductor substrate corresponding to FIG. 3.

FIGS. 5a to 7d show cross sections of the semiconductor substrate for illustrating third steps of the first embodiment.

FIG. 8 shows a top view on the semiconductor substrate for illustrating forth steps of the first embodiment.

FIGS. 9a to 9d show cross sections of the semiconductor substrate corresponding to FIG. 8.

FIGS. 10a to 12d show cross sections of the semiconductor substrate for illustrating fifth steps of the first embodiment.

FIGS. 15a to 15d show cross sections of the semiconductor substrate for illustrating a second embodiment of the invention.

FIG. 16 shows a top view on a semiconductor substrate for illustrating a third embodiment of the invention.

DETAILED DESCRIPTION OF THE PREFERRED EMBODIMENTS

Figure 7A:
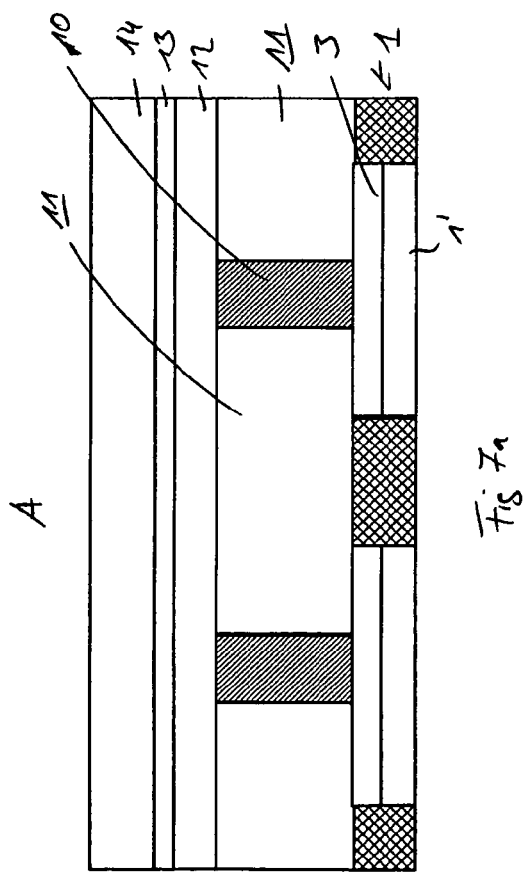
Figure 7B:
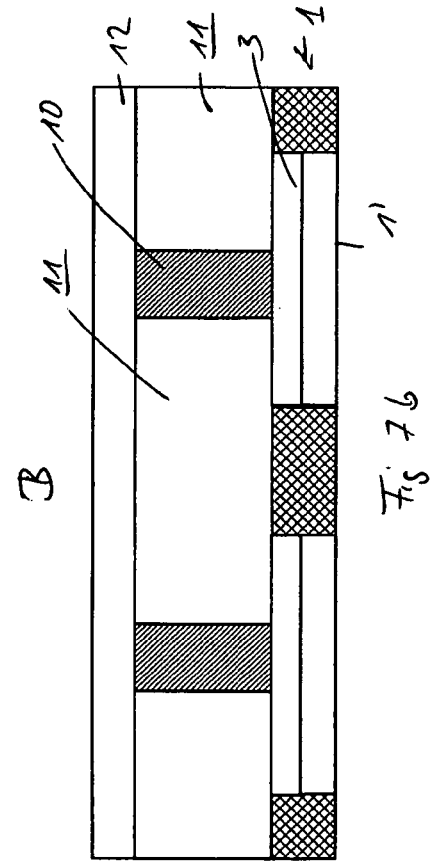
Figure 7C:
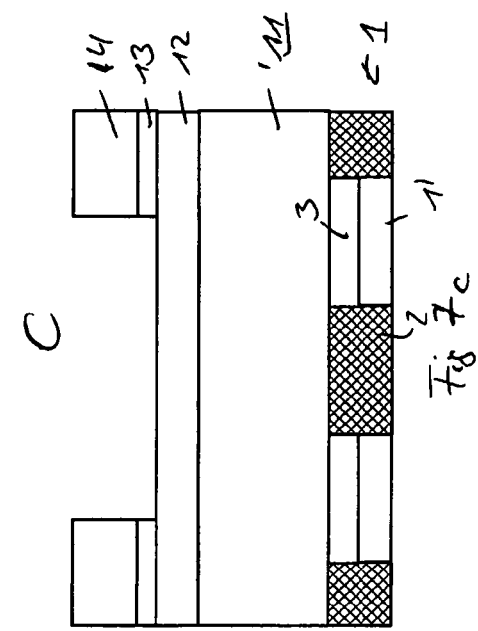
Figure 7D:
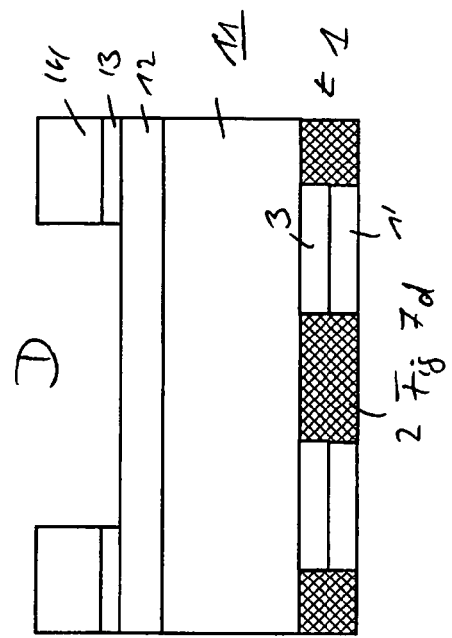
Figure 10A:
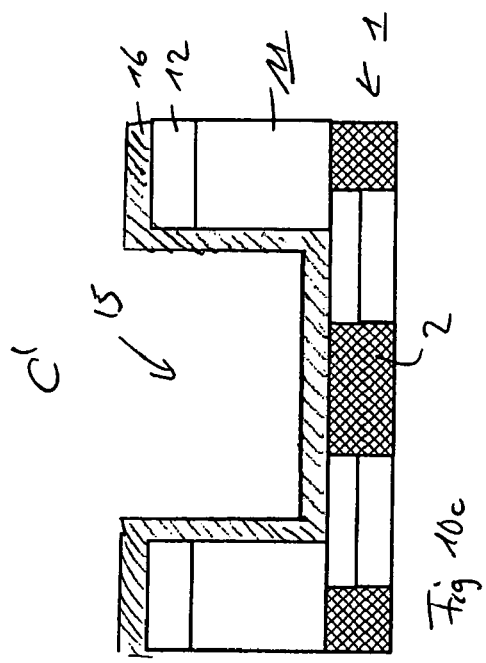
Figure 10C:
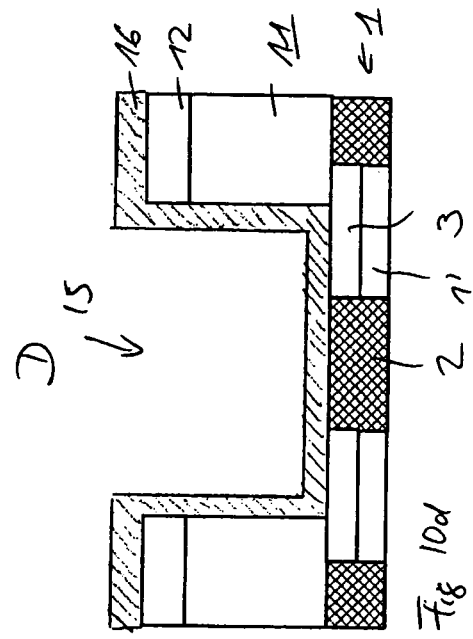
Figure 10B:
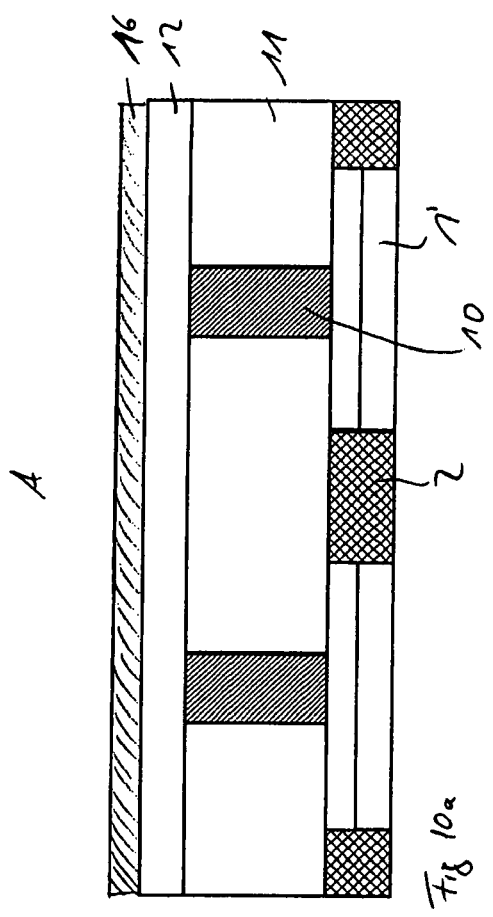
Figure 10D:
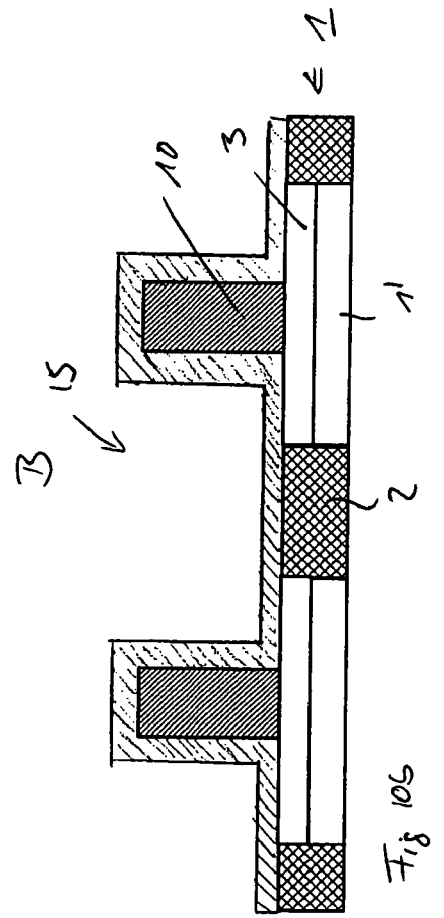

Identical reference signs in the FIGS. 1 to 16 designate identical or similar elements.

A first embodiment is described with reference to the FIGS. 1 to 14d. FIG. 1 shows a top view on a substrate 1, e.g. a semiconductor substrate. The substrate 1 may contain at least one of transistors, interconnecting lines and ground plates, which can be contacted via contact pads 2 on a substrate surface 101.

The contact pads 2 are regularly arranged on a grid. In the preferred and illustrated embodiment the contact pads 2 are placed at intersection points of lines 20 and rows 21. The lines 20 are perpendicular to the rows 21. A first spacing between neighbouring rows 21 is about 3 F. A second spacing between neighbouring lines 20 is about 2 F, thus, the second spacing is about two thirds of the first spacing. F denotes the minimal structural size that is achievable by the lithographic structuring methods used. At present F is less than 90 nm.

Cross sections along the line A, B, C and D in FIG. 1 are illustrated in FIGS. 2a, 2b, 2c and 2d, respectively. The substrate 1 may comprise a semiconductor substrate 1' having a stop etch layer 3' applied to its surface.

In first steps of the first embodiment a mold 4 is applied on the substrate surface 101. The mold 4 covers the contact pads 2 and the substrate surface 101. The height (vertical extension) of the mold 4 can be about 2 to 4 μm.

Preferably, the mold 4 is made of at least one of the group of silicon oxide, spin on glass, borophosphosilicate glass (BPSG), undoped silicon glass (USG). The mold 4 may comprise or consist of other materials like metals or metaloxides, as well. Deposition techniques are used that provide a high growth rate or deposition rate of the mold 4.

Optionally, a silicon layer 5 is applied on the mold 4.

A hard mask layer 6 is deposited on the substrate 1. The hard mask layer 6 is structured via a photo resist 7. This includes steps like depositing the photo resist 7, exposing the photo resist 7, selectively etching either the exposed or the non-exposed parts of the photo resist 7. Afterwards, the pattern of the structured photo resist 7 is transferred to the hard mask layer 6 via a selective etching process. The remaining photo resist 7 can be removed.

The pattern of the hard mask layer 6 comprises stripes, which cover each second row 23 of contact pads 2, e.g. odd numbered rows, and leaving exposed the other rows 24 of contact pads 2, e.g. the even numbered rows. The length of the stripes, i.e. their dimension in direction of the rows, is at least two times the distance between two neighbouring contact pads 2, e.g. 4F.

The pattern of the hard mask layer 6 is best illustrated in the top view of FIG. 3 after a further structuring process. Cross sections illustrating the structuring process are shown in FIGS. 4a to 4d. The pattern of the hard mask layer 6 is transferred into the mold 4 and the optional silicon layer 5 by a selective etching step.

Thus, trenches 8 are formed down to the substrate surface 101. The orientation of the trenches 8 is parallel to the rows of the contact pads 2. Each even numbered row 24 of contact pads 2 is exposed (cross section C) and each odd numbered row 23 remains covered by the mold 4 (cross section D). The masks 6 and 7 can be stripped off.

A first dielectric layer 9 is deposited in the trenches 8, in particular on the side walls 108 of the trenches 8 (FIGS. 5a to 5d). The first dielectric layer 9 can comprise a dielectric material having good electrical isolation properties, in preference silicon nitride.

A thickness d of the first dielectric layer 9 can be less than 1 F, preferably about 0.4 to 0.5 F. The thickness d of the first dielectric layer is measured at the side wall 108 of the trench and perpendicular to the side walls 108.

Due to the deposition techniques used the first dielectric layer 9 is applied onto the mold 4 and on the substrate 1, too. By an anisotropic etching process this unwanted part can be removed (FIGS. 6a to 6d). The ansiotropic etching may be a plasma assisted etching process. The silicon layer 5 can be used as an etch stop to prevent a removal of the remaining parts of the mold 4.

The remaining parts of the first dielectric layer 9 are forming spacers or first supporting walls 10 along the side walls 108 of the trenches 8. The orientation of the first supporting walls 10 is parallel to the rows of contact pads 2. Preferably, the first supporting walls 10 are placed in the middle between two rows of contact pads 2, as illustrated in FIG. 6a. This is achieved by selecting an appropriate masking pattern defining the width of the trenches 8. In other not illustrated embodiments the first supporting walls 10 are displaced from the middle. The first supporting walls 10 do not cover the contact pads 2.

The following steps are forming second supporting walls that are orthogonal to the first supporting walls 10.

A second mold 11 is formed on the substrate 1 and the first supporting walls 10 (FIGS. 7a to 7d). Prior a deposition of the second mold 11, remaining parts of the first mold 4 may be removed. Or the second mold 11 is provided simply by filling up the trenches 8 with fresh mold material. A chemical mechanical polishing process may be employed to provide a flat and planar surface. A silicon layer 12, a hard mask layer 13 and a photo resist 14 are deposited. The silicon layer 12 is optional.

The photo resist 14 is structured and its pattern is transferred to the hard mask layer 13 (FIG. 8). The pattern covers each second line 25 of contact pads instead of each second row 23 as taught along with FIGS. 2a to 2d and FIG. 3. Above even numbered lines 26 of contact pads 2 the hard mask layer 13 is removed (cross section B) and above odd numbered lines 25 of contact pads 2 the hard mask layer 13 remains (cross section A).

FIG. 8 shows the substrate 1 after a structuring process using the hard mask layer 13. The structuring process is shown in greater detail in the FIGS. 9a to 9d. Trenches 15 are formed by means of a selective etching process, e.g. a wet etch process.

The selective etching process only removes the exposed parts of the mold 11 along each second line 26. Thus, in the cross section B the first supporting walls 10 are completely exposed and free standing. The first supporting walls 10 are mechanically supported, however, by the remaining parts of the mold 11 in the odd numbered lines 25 (cross section A).

Figure 11A:
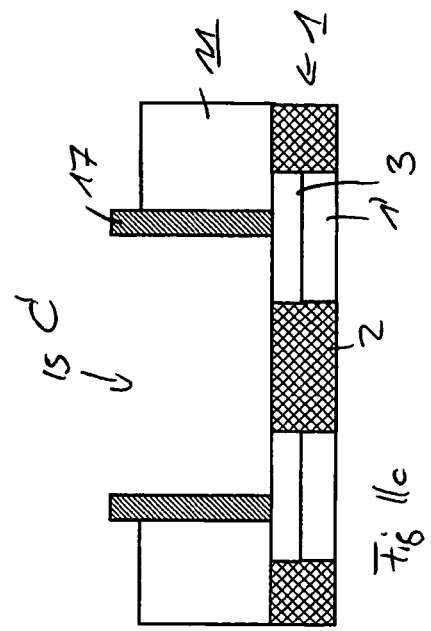
Figure 11B:
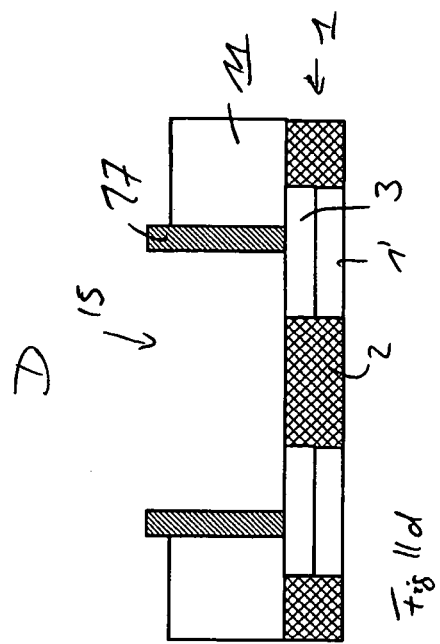
Figure 11C:
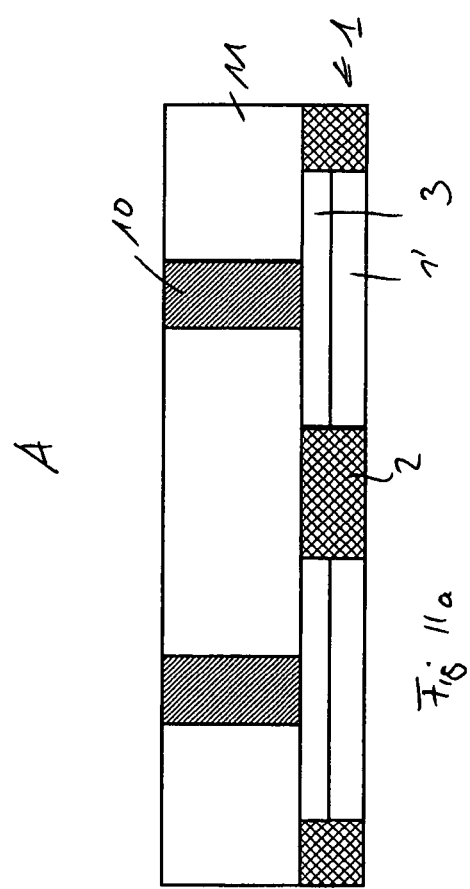
Figure 11D:
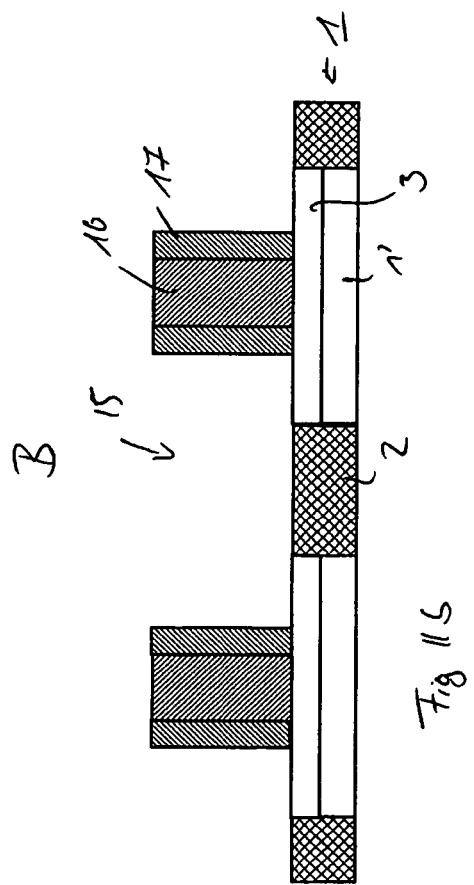

A second dielectric layer 16 is deposited (FIGS. 10a to 10d). Unwanted parts of the second dielectric layer 16, in particular on the substrate surface 101 and the mold 11, are removed by an anisotropic etching process (FIGS. 11a to 11b). The remaining parts of the second dielectric layer 15 are forming second supporting walls 17, which are arranged at the side walls of the trenches 15. Then the mold 11 is removed, as well (FIGS. 12a to 12d). A top view of the manufactured structure is illustrated in FIG. 13.

The second supporting walls 17 are orthogonal to the first supporting walls 10. This grid like structure gains its mechanical stability by the intersection of the first and second supporting walls 10, 17. The structure withstands further mechanical stress of further manufacturing steps without damage. It has been found that thickness of the second supporting walls 17 can be less than of the first supporting walls 10 without loss of stability.

Mechanical constraints do basically not limit the minimal allowable thickness of the second supporting walls. Therefore, the thickness of the dielectric layer 16 and hence of the second supporting walls is in the range of about 5 to 10 nm. In order to provide a sufficient isolation between the opposing sides of the second supporting walls despite the small thickness low-k dielectrics are preferred for the second dielectric layer 16.

Figure 13:
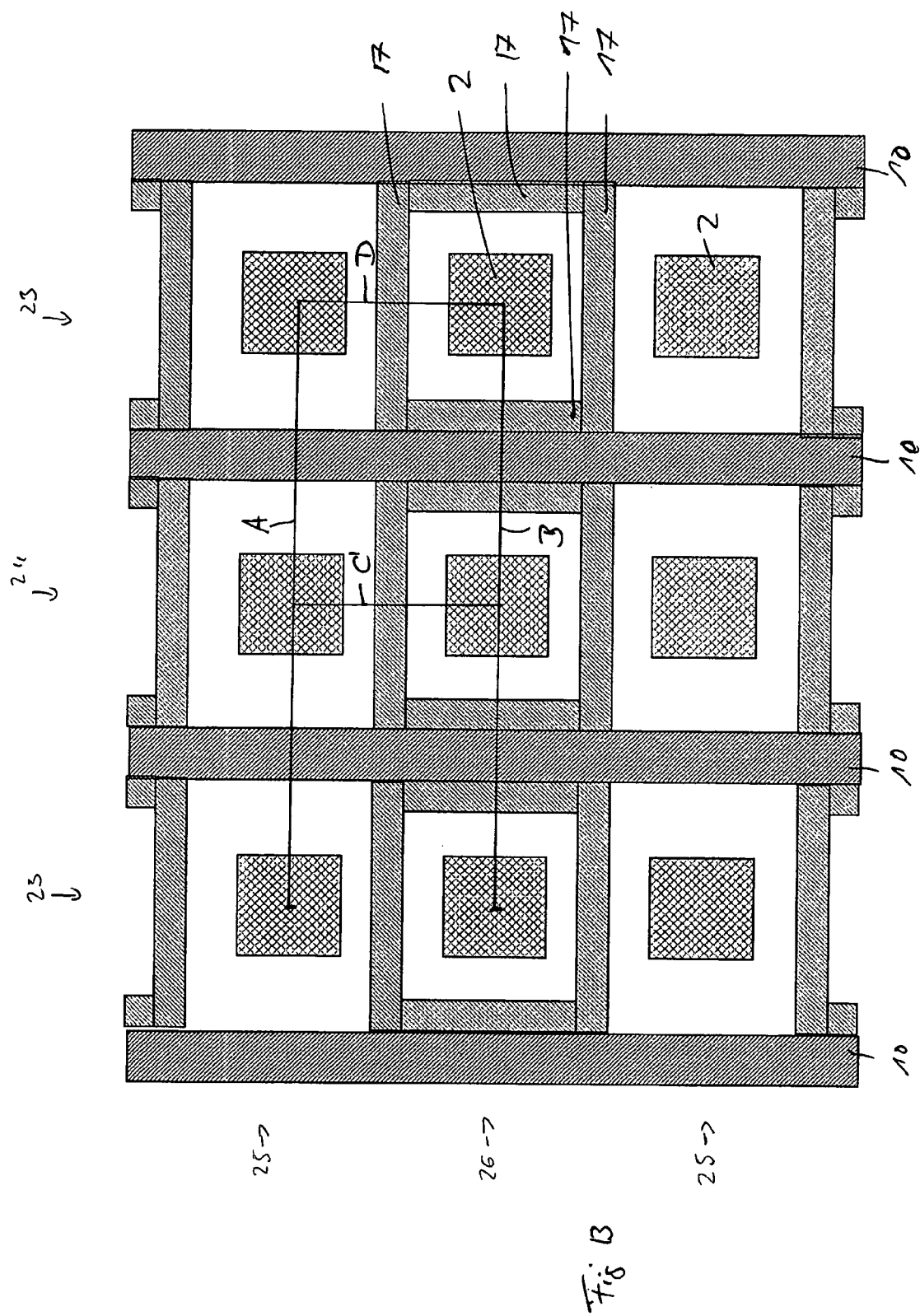
FIG. 13 shows a top view on the semiconductor substrate corresponding to FIGS. 12a to 12d.
Figures 14A, 14B, 14C, 14D:
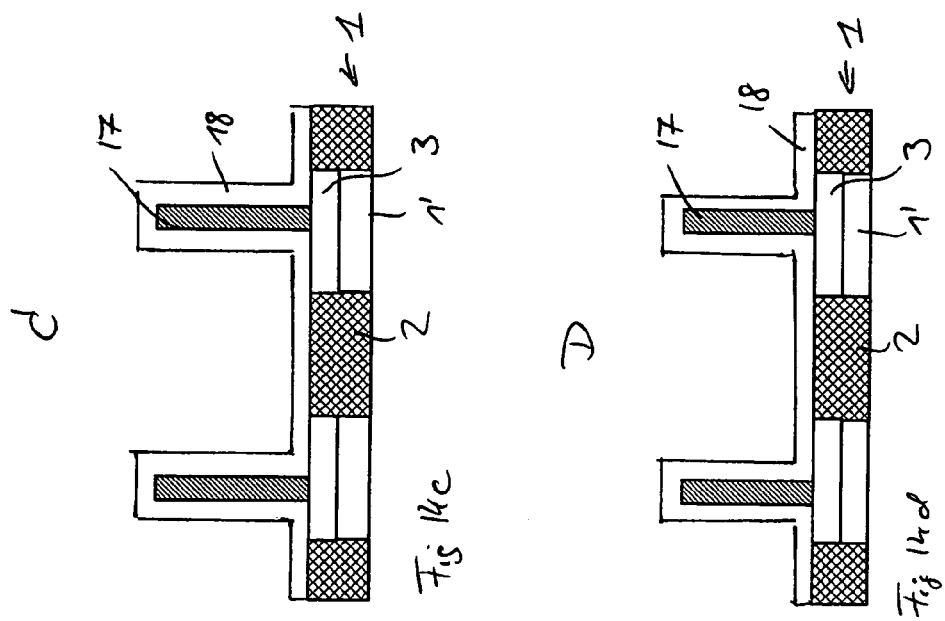
FIGS. 14a to 14d show cross sections of the semiconductor substrate for illustrating last steps of the first embodiment.

In the top view of FIG. 13 it is shown that cell sizes around the individual contact pads 2 differ. In particular, the second supporting walls 17 reduce the cell size around contact pads 2 arranged along even numbered lines 26. The cell sizes can be adjusted to be equal. The second supporting walls 17 are placed closer to the neighbouring odd numbered line 25 than to the neighbouring even numbered line 26. The placement of the second supporting walls 17 can be controlled by the pattern used for the hard mask layer 13 defining the trenches 15.

In a next step a conductive layer 18 is applied. The top parts of the conductive layer 18 are removed to form separated conductive layer sections (FIGS. 14a to 14d). A first exemplary method fills the trenches 8 with a sacrificial material. Afterwards a chemical mechanical polishing method is used to remove the top part of the conductive layer 18. Finally, the sacrificial material is selectively etched or ashed. A second exemplary method uses an etching process with a so called high RIE lag. This etching process is non-uniform. The etchrate is higher at the openings of the trenches 8, thus at the top of the conductive layer 18, compared to the bottom of the trench 8.

The conductive layer sections 18 are defining electrodes for a capacitor. They are in contact to the contact pads 2. The surface of the electrode is basically defined by the large surface of the first and second supporting walls 10, 17 (the drawings are not in scale). Advantageously, the electrode 18 is mechanically supported by the grid like structure of the walls 10, 17.

The complete capacitor can be formed starting from the above structure by depositing a dielectric layer and a second conductive layer, for instance.

A second embodiment is in part illustrated along with FIGS. 15a to 15d. The mold 4 may be formed of several layers 4a, 4b. The lower layer 4a is formed of BPSG and the upper layer 4b is formed of USG. The used wet etching methods or other etching methods to form the trenches have a higher etch rate with respect to BPSG than to USG. Due to a common effect the side walls of an etched trench tend to be narrower in a bottom part than at the upper opening of the trench. In this embodiment the bottom part becomes etched at relatively higher rate than the upper part, which compensates for the above effect. This takes place at stages corresponding to FIGS. 4a to 4d or 9a to 9d. The embodiment is not limited to the use of USG and BPSG. The mold 11 can be formed of two or more layers, as well. The manufacturing of the supporting grid and the electrode can be implemented as described in reference to the FIGS. 1 to 14d.

FIG. 16 shows a top view on a different substrate, which may be used as starting point for all embodiments thought above. The rows 30 and lines 31 are not perpendicular, but inclined under an angle α (alpha) in the range of 30° to 90°. The contact pads 2 on one row are separated by about 2 F whereas the contact pads 2 on one line are separated by about 3 F. In the further processing the mask layers have to be arranged parallel to the lines and rows alike the above embodiments. The manufacturing of the supporting grid and the electrode can be implemented as described in reference to the FIGS. 1 to 14d.

Although modifications and changes may be suggested by those skilled in the art, it is the intention of the inventor to embody within the patent warranted hereon all changes and modifications as reasonably and properly come within the scope of his contribution to the art.

The use of a hard mask is only one method for defining the trenches. A simple use of a structured photo resist may be implemented instead.

What is claimed is:

1. A method for manufacturing an integrated circuit with a capacitor electrode structure, comprising:

providing a substrate comprising contact pads arranged in lines and rows on a surface of the substrate, the lines being non-parallel to the rows;

applying a first mold on the substrate;

forming at least one first trench into the first mold above the contact pads, the first trench spanning over at least two contact pads arranged in one row;

forming first supporting walls from a first dielectric layer on side walls of the at least one first trench;

applying a second mold on the substrate;

forming at least one second trench into the second mold, the second trench spanning over at least two contact pads arranged in one line;

forming second supporting walls from a second dielectric layer on side walls of the at least one second trench;

applying a conductive layer on the first and second supporting walls for forming a first electrode of the capacitor structure.

2. The method according to claim 1, wherein the lines are perpendicular to the rows.

3. The method according to claim 1, wherein the lines and rows are forming an angle in the range of 30 to 90 degrees.

4. The method according to claim 1, wherein the width of the first trench and the width of the second trench are at least larger than the dimension of the contact pad.

5. The method according to claim 1, wherein the contact pads are separated from each other along the lines by first distance and are separated from each other along the rows by a second distance, the first distance being approximately twice the second distance.

6. The method according to claim 1, wherein the first dielectric layer is applied with a first thickness and the second dielectric layer is applied with a second thickness, the first thickness being larger than this second thickness.

7. The method according to claim 1, wherein the first mold comprises a first mold layer, which is chosen to be etched at the first etch rate with an etch agent, and a second mold layer, which is chosen to be etched at a second etch rate with the etch agent, the second etch rate being larger than the first etch rate.

8. The method according to claim 1, wherein the second mold fills the first trenches.

9. The method according to claim 1, wherein forming the second trench comprises etching the first and second molds selective to the first dielectric layer, thereby forming freestanding supporting sidewalls in the second trenches.

10. The method according to claim 1, wherein the substrate is planarized after applying the second mold.

11. The method according to claim 1, further comprising removing the first mold before applying the second mold.

* * * * *